United States Patent
Gu et al.

(10) Patent No.: US 11,728,383 B2
(45) Date of Patent: Aug. 15, 2023

(54) LOCALIZED STRESSOR FORMATION BY ION IMPLANTATION

(71) Applicant: Applied Materials, Inc., Santa Clara, CA (US)

(72) Inventors: Sipeng Gu, Gloucester, MA (US); Wei Zou, Gloucester, MA (US); Kyu-Ha Shim, Gloucester, MA (US); Qintao Zhang, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 17/032,419

(22) Filed: Sep. 25, 2020

(65) Prior Publication Data

US 2022/0102500 A1    Mar. 31, 2022

(51) Int. Cl.
*H01L 29/10*    (2006.01)
*H01L 29/76*    (2006.01)
*H01L 21/265*    (2006.01)

(52) U.S. Cl.
CPC ........ *H01L 29/1054* (2013.01); *H01L 21/265* (2013.01); *H01L 29/7606* (2013.01)

(58) Field of Classification Search
CPC combination set(s) only.
See application file for complete search history.

(56) References Cited

U.S. PATENT DOCUMENTS

| | | | |
|---|---|---|---|
| 6,743,651 B2 | 6/2004 | Chu et al. | |
| 6,846,727 B2 | 1/2005 | Fogel et al. | |
| 6,855,994 B1 | 2/2005 | King et al. | |
| 9,515,088 B1* | 12/2016 | Akarvardar | H01L 27/11807 |
| 9,917,103 B1 | 3/2018 | Mulfinger et al. | |
| 2001/0023116 A1* | 9/2001 | Wurzer | H01L 21/28202 438/528 |
| 2006/0194411 A1 | 8/2006 | Hargrove | |
| 2009/0042357 A1 | 2/2009 | O'Connell | |
| 2012/0292673 A1* | 11/2012 | Xu | H01L 29/7843 438/303 |
| 2014/0127871 A1* | 5/2014 | Grenouillet | H01L 29/78684 438/285 |
| 2015/0137268 A1* | 5/2015 | Fung | H01L 29/785 438/299 |

(Continued)

*Primary Examiner* — Moin M Rahman
*Assistant Examiner* — Mohammad A Rahman
(74) *Attorney, Agent, or Firm* — Nields, Lemack & Frame, LLC

(57) ABSTRACT

A P-type field effect transistor (PFET) device and a method for fabricating a PFET device using fully depleted silicon on insulator (FDSOI) technology is disclosed. The method includes introducing germanium into the channel layer using ion implantation. This germanium implant increases the axial stress in the channel layer, improving device performance. This implant may be performed at low temperatures to minimize damage to the crystalline structure. Further, rather than using a long duration, high temperature anneal process, the germanium implanted in the channel layer may be annealed using a laser anneal or a rapid temperature anneal. The implanted regions are re-crystallized using the channel layer that is beneath the gate as the seed layer. In some embodiments, an additional oxide spacer is used to further separate the raised source and drain regions from the gate.

10 Claims, 6 Drawing Sheets

(56) References Cited

U.S. PATENT DOCUMENTS

| | | | |
|---|---|---|---|
| 2015/0364570 A1* | 12/2015 | van Meer | H01L 29/6659 |
| | | | 438/305 |
| 2016/0204039 A1* | 7/2016 | Togo | H01L 21/324 |
| | | | 257/369 |
| 2017/0053915 A1* | 2/2017 | Ando | H01L 21/28255 |
| 2017/0084456 A1* | 3/2017 | Olsen | H01L 21/02046 |
| 2020/0144064 A1* | 5/2020 | Liu | H01L 21/2822 |
| 2021/0175338 A1* | 6/2021 | Drescher | H01L 21/823814 |

* cited by examiner

LOCALIZED STRESSOR FORMATION BY ION IMPLANTATION

FIELD

Embodiments of this disclosure are directed to P-type field effect transistor (PFET) devices and a method for creating PFET devices, and more particularly for creating PFET devices using fully depleted silicon on insulator (FDSOI) technology.

BACKGROUND

As transistors continue to shrink in dimension, new approaches are being pursued. One such approach is referred to as fully depleted silicon on insulator (FDSOI). To create an FDSOI device, first a workpiece is prepared which has a bulk region, which may be a N-type ground plane. Disposed on top of the bulk region is a buried oxide (BOX) layer. The BOX layer may be silicon dioxide. Above the BOX layer is the channel layer. The channel layer may be silicon for N-type field effect transistor (NFET) devices and may be silicon-germanium for P-type field effect transistor (PFET) devices. The semiconductor device is created by forming source and drain regions on top of the channel layer. Further, between the source and drain regions, a gate is formed. The gate may include a high dielectric constant material disposed on the channel layer to form a Hi-K layer. A work function (WF) metal may be disposed on top of the Hi-K layer. Polysilicon may be grown on top of the WF metal.

Because the channel layer is very thin, such as 20 nanometers (nm) or less, the channel layer beneath the gate is not doped. However, the device performance is improved if there is axial stress in the channel layer.

Previously, for PFET devices, this additional axial stress may be created by using self-aligned in plane stressors (SAIPS). In this method, germanium condensation is used to increase the germanium concentration in the source/drain area channel layer on either side of the gate. This approach utilizes a long duration, high temperature anneal process to allow the germanium to diffuse into the channel layer. However, this anneal process is incompatible with gate-first high k-metal gate (HKMG) processes, as the metal gate cannot tolerate this thermal treatment.

Thus, it is would be beneficial if there were a PFET device and a method for fabricating the PFET device that was compatible with gate-first HKMG processes. Furthermore, it would be advantageous if this method also reduces the capacitance between the gate and the source/drain ($C_{gd}$) so as to allow improved high frequency performance of the PFET device.

SUMMARY

A P-type field effect transistor (PFET) device and a method for fabricating a PFET device using fully depleted silicon on insulator (FDSOI) technology is disclosed. The method includes introducing germanium into the channel layer using ion implantation. This germanium implant increases the axial stress in the channel layer, improving device performance. This implant may be performed at low temperatures to minimize damage to the crystalline structure. Further, rather than using a long duration, high temperature anneal process, the germanium implanted in the channel layer may be annealed using a laser anneal or a rapid temperature anneal. The implanted regions are re-crystallized using the channel layer that is beneath the gate as the seed layer.

Additionally, the height of the raised source and drain regions may be reduced which serves to further decrease Cgd. In some embodiments, an additional oxide spacer is used to further separate the raised source and drain regions from the gate.

According to one embodiment, a method of fabricating a P-type Field Effect Transistor (PFET) device using fully depleted silicon on insulator (FDSOI) technology is disclosed. The method comprises forming a gate on a workpiece, the workpiece comprising a bulk region, a buried oxide layer and a channel layer; wherein the gate comprises a Hi-K/SiO$_2$ bi-layer, a work function metal, a polysilicon layer and a cap layer; implanting germanium ions into the channel layer in regions that are not beneath the gate to form SiGe stressors in the channel layer; performing a thermal treatment to recrystallize the SiGe stressors after the implanting; and growing raised source and drain regions on the SiGe stressors on both sides of the gate. In certain embodiments, the channel layer comprises Si—Ge and a concentration of germanium prior to the implant is about 35%. In certain embodiments, the concentration of germanium in the SiGe stressors after implanting is greater than 40%. In some embodiments, the concentration of germanium in the SiGe stressors after implanting is between than 45% and 60%. In certain embodiments, the implanting is performed at a temperature between −50° C. and −150° C. In certain embodiments, the method further comprises forming spacers on both side of the gate before the implanting; depositing an oxide layer on the workpiece after the spacers are formed and prior to the thermal treatment; and removing at least a portion of the oxide layer after the thermal treatment and prior to growing the raised source and drain regions. In some embodiments, the oxide layer is deposited prior to the implanting. In certain embodiments, an entirety of the oxide layer is removed. In certain embodiments, a portion of the oxide layer is removed and a remaining portion of the oxide layer is disposed on a sidewall of the spacers, wherein the remaining portion is referred to as a partial oxide spacer, and the partial oxide spacer increases a distance between the raised source and drain regions and the gate. In certain embodiments, the portion of the oxide layer is removed using directional reactive ion etching. In certain embodiments, the thermal treatment comprises a rapid temperature anneal or a laser anneal.

According to another embodiment, a PFET device is disclosed. The PFET device comprises a workpiece comprising a bulk region, a buried oxide layer and a channel layer, wherein the channel layer comprises Si—Ge with a concentration of germanium of up to 35%; a gate disposed on a portion of the channel layer, the gate comprising a Hi-K/SiO$_2$ bi-layer, a work function metal, a polysilicon layer and a cap layer; SiGe stressors disposed in the channel layer on both sides of the gate, wherein the concentration of germanium in the SiGe stressors is at least 40%; and raised source and drain regions disposed on top of the SiGe stressors. In certain embodiments, the height of the raised source and drain regions is less than 25 nm. In certain embodiments, the PFET device further comprises a spacer disposed between the gate and the raised source and drain regions. In certain embodiments, the PFET device further comprises a partial oxide spacer disposed between the spacer and the raised source and drain regions. In certain embodiments, the height of the partial oxide spacer is less than a height of the spacer. In some embodiments, the concentration of germanium in the SiGe stressors is at least 45%.

According to another embodiments, a PFET device is disclosed. The PFET device comprises a workpiece comprising a bulk region, a buried oxide layer and a channel layer, wherein the channel layer comprises Si—Ge with a concentration of germanium of up to 35%; a gate disposed on a portion of the channel layer, the gate comprising a Hi-K/SiO$_2$ bi-layer, a work function metal, a polysilicon layer and a cap layer; spacers disposed on both sides of the gate; partial oxide spacers; and raised source and drain regions disposed on top of the channel on both sides of the gate; wherein the partial oxide spacers are disposed between the spacers and the raised source and drain regions. In certain embodiments, the height of the partial oxide spacer is less than a height of the spacer. In certain embodiments, the dielectric constant of the partial oxide spacers is greater than a dielectric constant of the spacers.

BRIEF DESCRIPTION OF THE FIGURES

For a better understanding of the present disclosure, reference is made to the accompanying drawings, which are incorporated herein by reference and in which.

DETAILED DESCRIPTION

As noted above, FDSOI is being pursued as a mechanism to fabricate smaller transistors. Fully depleted SOI implies that the channel layer is not doped. Rather, the thinness of the channel layer allows the transistor to transport carriers (either electrons or holes). Axial stress, such as a compressive stress, may be beneficial to improve the ability of the device to transport these carriers, and especially holes.

FIGS. 1A-1H show the PFET device during the fabrication process. FIG. 2 is a flow chart showing this fabrication process.

Figure 1A:
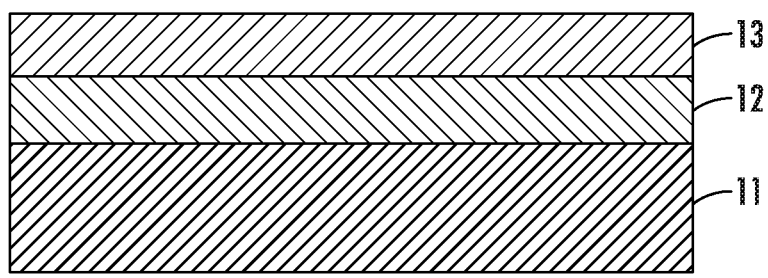
FIGS. 1A-1H show the creation of a FDSOI PFET according to one embodiment.
Figure 2:
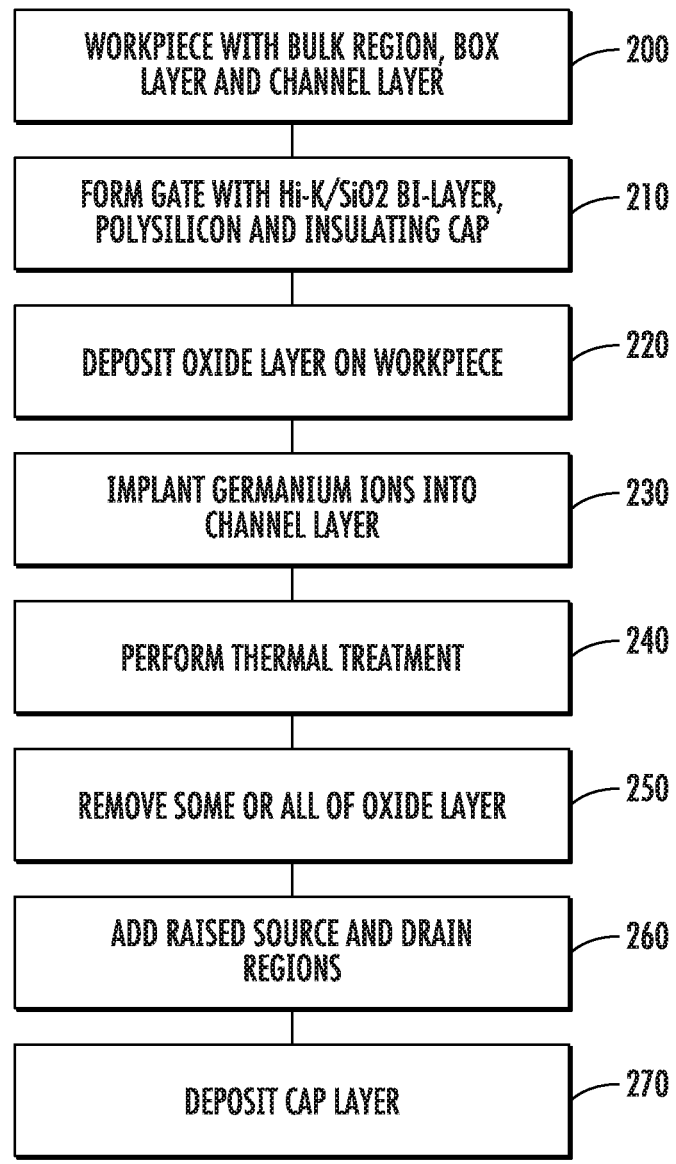
FIG. 2 shows the sequence of operations to create the FDSOI PFET according to one embodiment.

FIG. 1A shows the workpiece 10 prior to the formation of the PFET device. Specifically, the workpiece 10 is a SOI workpiece and comprises a bulk region 11, which may be a N-type ground plane. This bulk region 11 may be silicon that is doped with phosphorus, arsenic or another suitable species.

Disposed above the bulk region 11 is a buried oxide layer, or BOX layer 12. The BOX layer 12 may comprise a layer of silicon dioxide with a thickness of 10 nm-200 nm. In certain embodiments, the thickness of the BOX layer 12 is about 25 nm.

Finally, a channel layer 13 is disposed above the BOX layer 12. For a PFET device, the channel layer 13 may be SiGe, where up to 35% of the material in the channel layer 13 comprises germanium. The doping of the channel layer 13 may be achieved using germanium condensation or another suitable process.

Germanium condensation includes the deposition of a germanium layer on top of a silicon channel layer. During a long duration, high temperature anneal process, germanium diffuses into the channel layer 13, such that up to about 35% of the channel layer 13 comprises germanium.

The channel layer 13 may have a thickness of up to 80 nm. In certain embodiments, the thickness of the channel layer 13 may be between 8 nm and 20 nm.

Thus, the fabrication process begins with a workpiece 10 having a bulk region 11, a BOX layer 12 and a channel layer 13, as shown in Box 200 of FIG. 2.

Figure 1B:
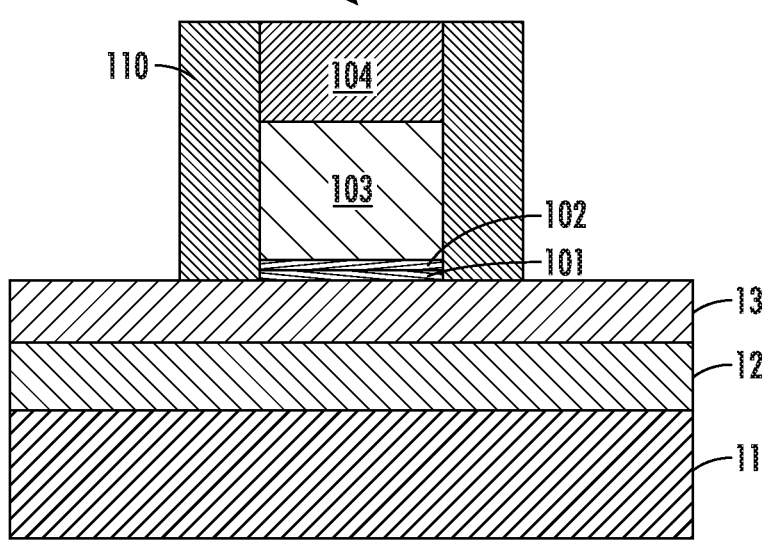

As shown in Box 210 of FIG. 2 and in FIG. 1B, the gate 100 is formed next. To create the gate, the workpiece 10 may be patterned. For example, a mask may be disposed on those portions of the workpiece where the gate 100 is not to be formed.

First, a high dielectric constant material is applied to the top surface of the channel layer 13 to form a Hi-K/SiO$_2$ bi-layer 101. The typical thickness of this bi-layer may be 1 nm to 5 nm and 0.5 nm to 2 nm of Hi-K and SiO$_2$, respectively. The high dielectric constant materials include, but are not limited to, HfO$_2$, HfSiO, HfSiON, Zro$_2$, La$_2$O$_3$, Al$_2$O$_3$, TiO$_2$, SrTiO$_3$, Y$_2$O$_3$, HfO$_x$N$_y$, ZrO$_x$N$_y$, Al$_2$O$_x$N$_y$, and TiO$_x$N$_y$. In certain embodiments, the value of x is between 0.5 to 3 and is independent of y, while the value of y is between 0 to 2 and is independent of x.

A work function (WF) metal 102 is then formed on the Hi-K/SiO$_2$ bi-layer 101. This WF metal 102 may be TiN, TaN, TaAlN, or another material in some embodiments. The WF metal 102 may be between 2 nm and 15 nm, based on threshold voltage tuning. Of course, other thicknesses are also possible. A polysilicon layer 103 may then be disposed on top of the WF metal 102. The polysilicon layer 103 may be between 30 nm and 60 nm, although other thicknesses are possible. An insulating cap layer 104, such as a silicon nitride cap, is then disposed on the polysilicon layer 103. The insulating cap layer 104 may be between 5 nm and 20 nm, although other thicknesses are also possible.

The Hi-K/SiO$_2$ bi-layer 101, the WF metal 102, the polysilicon layer 103 and the insulating cap layer 104 may be formed using suitable deposition processes such as, but not limited to, sub-atmosphere pressure chemical vapor deposition (SACVD), low-pressure chemical vapor deposition (LPCVD), plasma-enhanced CVD (PECVD), atomic layer deposition (ALD), and sputtering.

The Hi-K/SiO$_2$ bi-layer 101, the WF metal 102, the polysilicon layer 103 and the insulating cap layer 104 form the gate 100. Additionally, spacers 110 are disposed on either side of the gate 100. The spacers 110 may be created using chemical vapor deposition (CVD), plasma enhanced chemical vapor deposition (CVD), atomic layer deposition (ALD), sputtering, or other processes. The spacers 110 may comprise a dielectric material, such as, but are not limited to, silicon boron carbon nitride (SiBCN), SiOCN, SiCOH, SiCN, and SiON dielectric materials. The spacers 110 may be as tall as the gate 100. The width of the spacers 110 may be between 2 and 50 nm. The spacers 110 are used to physically separate the gate 100 from the raised source and drain regions 140.

Figure 1C:
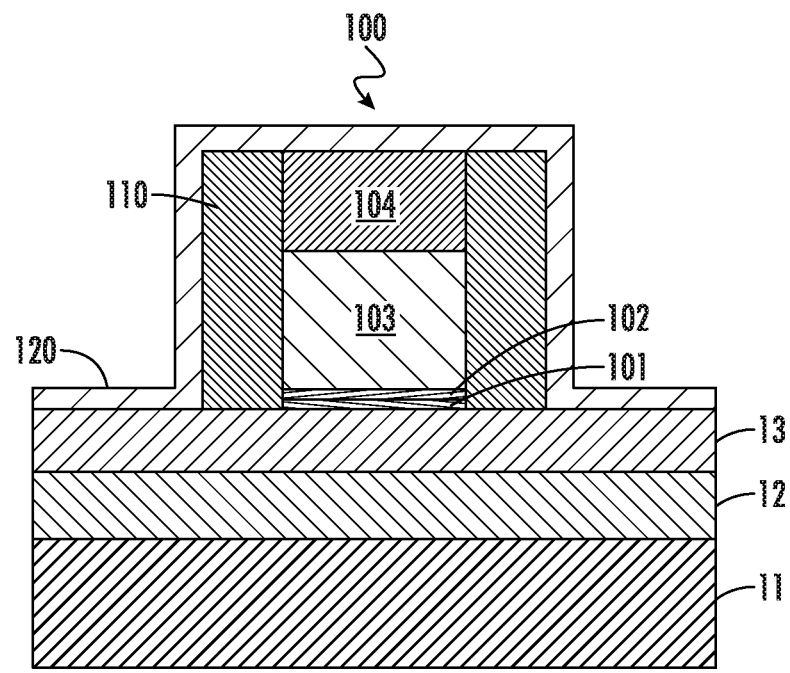

As shown in Box 220 of FIG. 2 and in FIG. 1C, an oxide layer 120 is then deposited on the entirety of the device. This oxide layer 120 may be conformally deposited using chemical vapor deposition (CVD), atomic layer deposition (ALD) or other suitable processes. This oxide layer 120 may be about 5 nm, although other thicknesses are also possible, such as between 1 nm and 10 nm. This oxide layer 120 may be silicon dioxide or a different oxide. The oxide layer 120 is used to minimize channeling and prevent out diffusing of germanium during a subsequent thermal treatment, as described below.

Figure 1D:
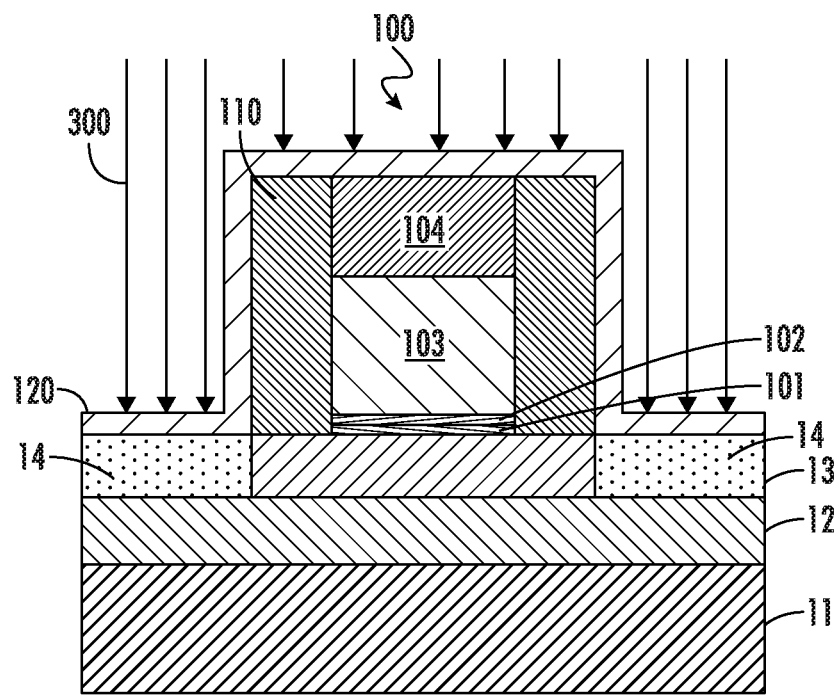

Next, as shown in in Box 230 of FIG. 2 and FIG. 1D, germanium ions 300 are implanted into the workpiece 10.

This implant may be performed at cold temperatures, such as −50° C. or less. In certain embodiments, the implant may be performed at a temperature between −50° C. and −150° C. In other embodiments, the implant may be performed at a temperature of −150° C.

The implant may be performed in a variety of manners. In one embodiment, a beam line ion implantation system may be used. The beam line ion implantation system typically comprises an ion source, extraction optics, a mass analyzer, a mass resolving aperture, a collimator, and acceleration and deceleration stages. The beam line ion implantation system may utilize a ribbon ion beam or a scanned ion beam. A germanium containing species may be introduced into the ion source. Germanium ions 300 are attracted through the extraction aperture of the ion source by negatively biasing the extraction optics. These ions are directed through the mass analyzer, wherein ions of different mass/charge ratios travel through different paths. The ions of the desired species and charge pass through the mass resolving aperture and may be accelerated or decelerated. Further, in certain embodiments, an electrostatic scanner may be used to create a scanned ion beam from a spot ion beam. A collimator may then be used to create a plurality of parallel beamlets that impact the workpiece.

The germanium ions 300 are implanted into the channel layer 13 in regions that are not beneath the gate 100. The use of cold temperatures may reduce the damage to the crystalline structure of the channel layer 13 caused by the implanted germanium ions 300. This reduction in damage may accelerate and/or improve the quality of the recrystallization process. However, in other embodiments, the implant may be performed at room temperature or high temperature. In these cases, the duration of the subsequent thermal treatment may be extended to repair the damage caused to the crystal structure.

In certain embodiments, the implant may be performed using an implant energy that is less than 5 keV. In certain embodiments, the implant energy may be between 1 keV and 30 keV, depending on the thickness of the oxide layer 120 and the channel layer 13.

The purpose of the germanium implant is to increase the concentration of germanium in portions of the channel layer 13. Specifically, this implant of germanium ions 300 creates the regions of high germanium concentration in the channel layer 13, located on either side of the gate 100. These regions of high germanium concentration may be referred to as SiGe stressors 14. In certain embodiments, the dose is sufficient to raise the concentration of germanium in the SiGe stressors 14 to 40% or more. In some embodiments, the concentration of germanium in the SiGe stressors 14 is increased to 45% or more. In certain embodiments, the concentration of germanium in the SiGe stressors 14 is increased to up to 60%. In certain embodiments, the dose may be greater than $1E14$ atoms/cm$^2$. In certain embodiments, the dose may be as high as $1E17$ atoms/cm$^2$.

Figure 3:
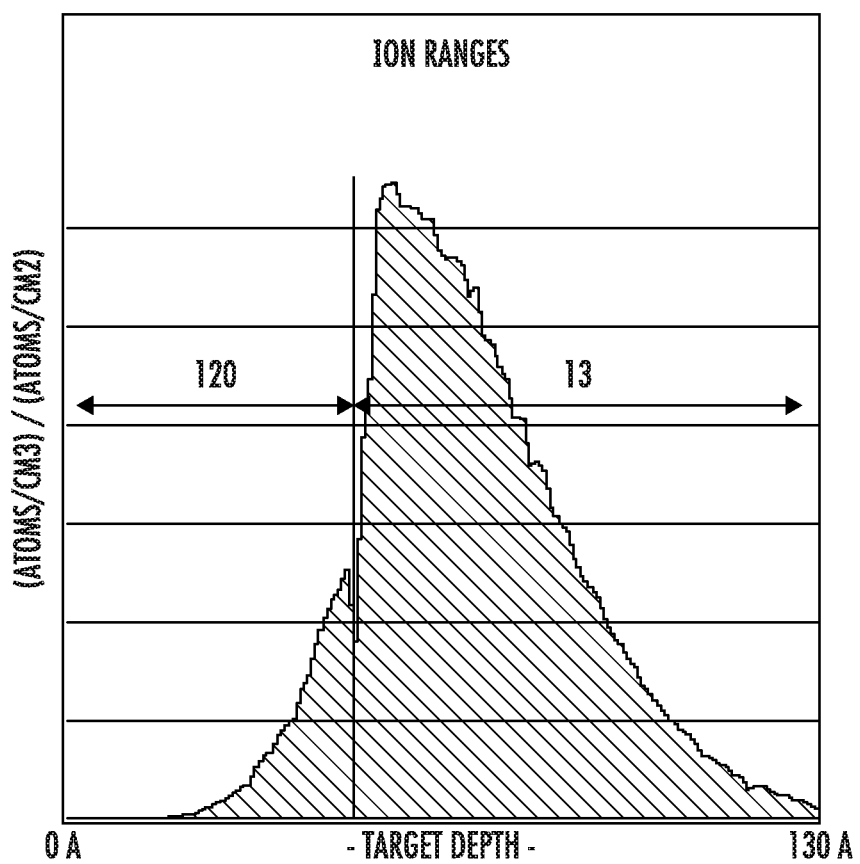
FIG. 3 shows the simulated ion distribution of the implant shown in FIG. 1D.

FIG. 3 shows a simulation showing the concentration of germanium ions 300 following an implant with an implant energy of 3 keV and a dose of $2E15$ atoms/cm$^2$. In this figure, it is assumed that the oxide layer 120 is silicon dioxide and is 5 nm in thickness. Further, the channel layer 13 is assumed to be 8 nm in thickness. Note that most of the germanium ions 300 pass through the oxide layer 120 and are implanted into the channel layer 13.

Figure 1E:
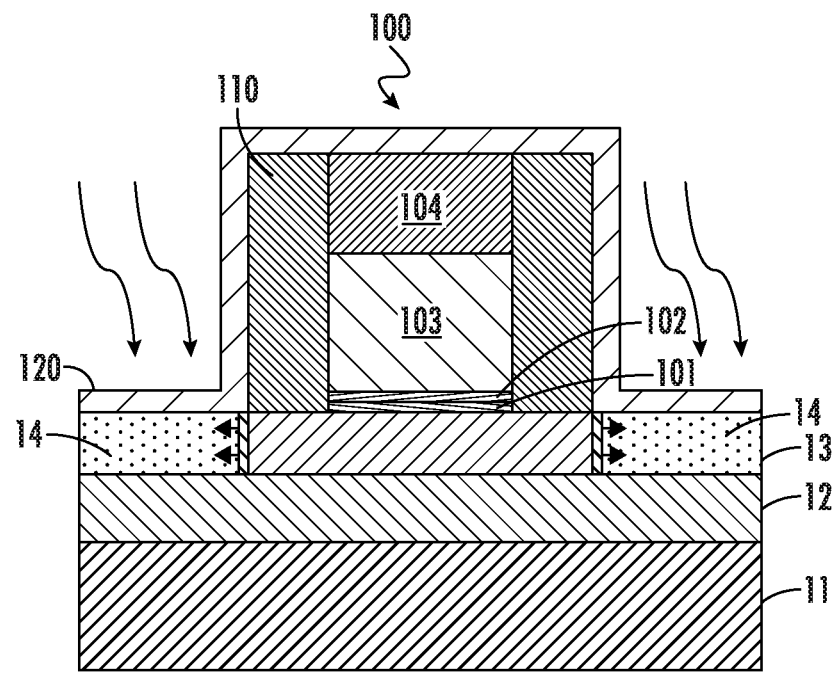

Next, as shown in in Box 240 of FIG. 2 and FIG. 1E, a thermal treatment is performed. The thermal treatment may be a laser anneal or a rapid temperature anneal. This thermal treatment is not deleterious to the WF metal 102. Thus, there is no damage to the gate 100 during this thermal treatment.

Advantageously, the channel layer 13 disposed beneath the gate 100 serves as the seed layer for the recrystallization of the SiGe stressors 14 of the channel layer 13. Thus, the SiGe stressors 14 recrystallize in the lateral direction, extending away from the gate 100.

Figure 1F:
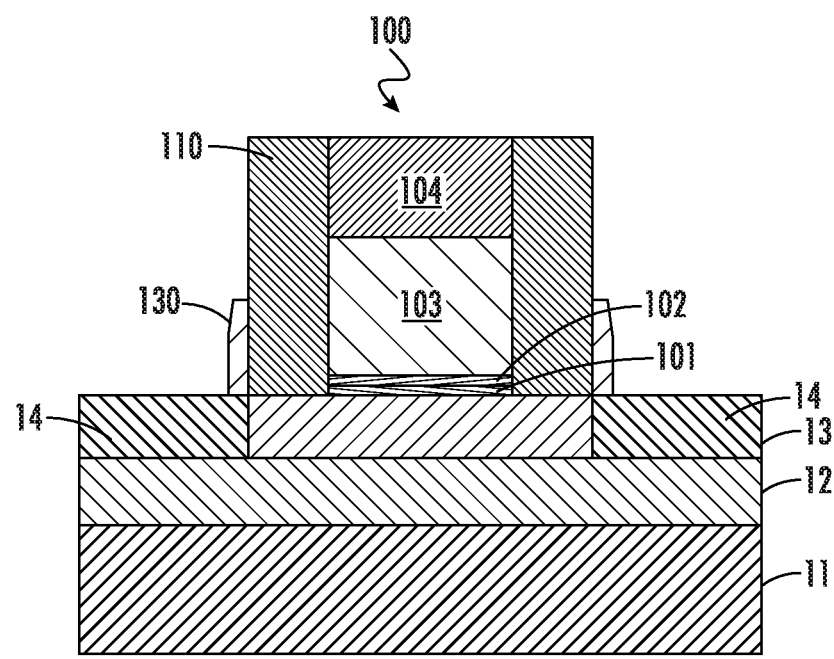

As shown in Box 250 of FIG. 2 and in FIG. 1F, some or all of the oxide layer 120 is removed. A reactive ion etch (RIE) process may be used to remove the oxide layer 120. In certain embodiments, a directional RIE process may be performed so as to only partially remove the oxide layer 120, such that the oxide layer 120 remains along a portion of the side wall of the spacers 110. This remaining portion may be referred to as partial oxide spacers 130. In certain embodiments, the height of the partial oxide spacers 130 may be about half of the height of the gate 100. In certain embodiments, the partial oxide spacers 130 are of a height that is less than the thickness of the raised source and drain regions, as described below. The width of the partial oxide spacers 130 may be 10 nm or less.

The partial oxide spacers 130 typically have a higher dielectric constant than the spacers 110.

In certain embodiments, all of the oxide layer 120 is removed such that the partial oxide spacers are not present.

Figure 1G:
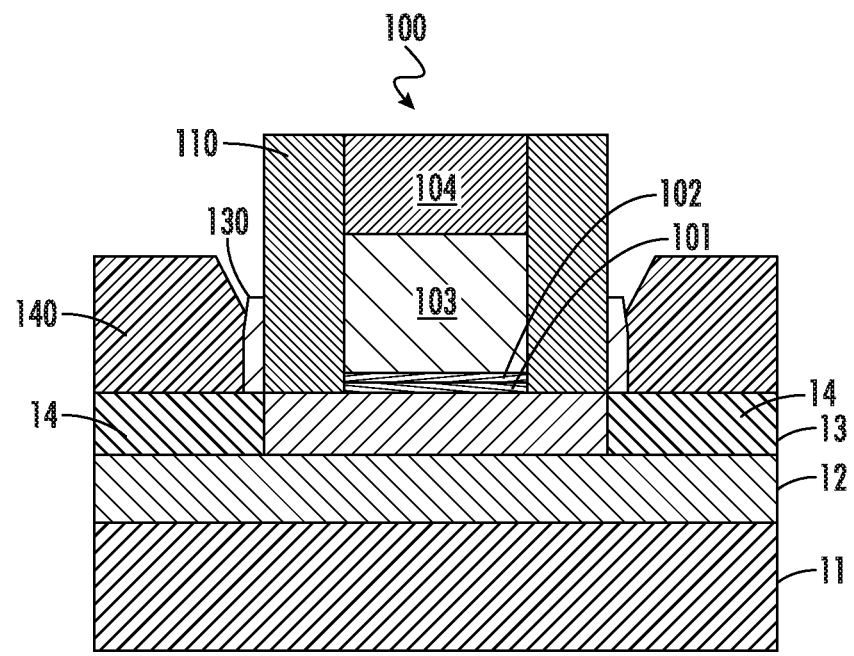

As shown in Box 260 of FIG. 2 and in FIG. 1G, the raised source and drain regions 140 are added. The raised source and drain regions 140 may be created through an in-situ doped epitaxial growth process. The epitaxial process may introduce a silicon-containing gas and a germanium containing gas in a chamber containing the workpiece 10. In this way, a layer of SiGe material is created on top of the SiGe stressors 14. The concentration of germanium in the raised source and drain regions 140 may be between 30% and 40%. In some embodiments, the height of the raised source and drain regions 140 may be less than 30 nm. In some embodiments, the height of the raised source and drain regions 140 may be less than 25 nm. In certain embodiments, the total thickness of the SiGe stressors 14 and the raised source and drain regions 140 is 30 nm or less.

The height of the partial oxide spacer 130, if present, may be at least as tall as the height of the raised source and drain regions 140 so as to further separate the raised source and drain regions 140, which are SiGe, from the gate 100.

Figure 1H:
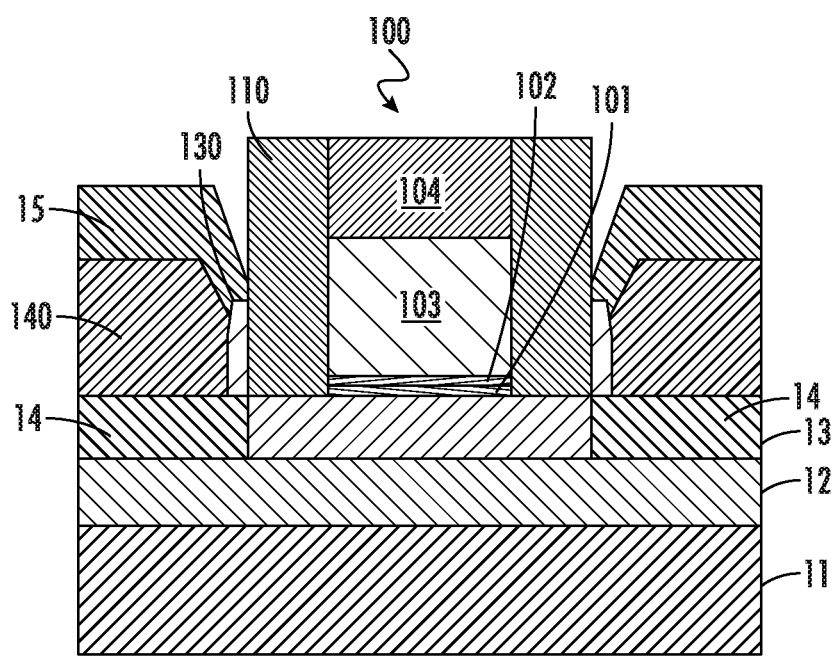

As shown in Box 270 of FIG. 2 and in FIG. 1H, a cap layer 15 may be applied on top of the raised source and drain regions 140. The cap layer 15 may be silicon nitride and may be formed using a CVD process. The thickness of the cap layer 15 may be between 5 and 100 nm. The cap layer 15 may serve to protect the device from downstream etching or cleaning processes. This may also further isolate the gate 100.

Subsequent to this, traditional processes may be performed, such as chemical mechanical planarization (CMP), middle of line (MOL) contact formation and back end of line (BOEL) processing.

There are several modifications that may be made to this fabrication process.

For example, in one embodiment, the oxide layer 120 (see Box 220) is deposited on the workpiece after the germanium implant (see Box 230). In this scenario, the implant energy may be reduced from the values noted above. In this embodiment, the remainder of the sequence is as shown in FIG. 2.

In another embodiment, the oxide layer 120 may not be deposited. In this embodiment, the implant energy may be reduced from the values stated above.

In yet another embodiment, the implant of germanium ions (Box 230 in FIG. 2) may be omitted. In this embodiment, the partial oxide spacers 130 are still created, and the height of the raised source and drain regions 140 may be increased, as compared to the fabrication sequence shown in FIG. 2.

The system and method described herein have many advantages. First, the germanium implant creates SiGe stressors 14 in the channel layer 13. These SiGe stressors 14 provide axial stress in the channel layer 13. In this way, the height of the raised source and drain regions 140 may be reduced, while maintaining the same amount of stress. A reduction in the height of the raised source and drain regions 140 (which is equal to the thickness of the channel layer 13) results in reduced gate-drain capacitance ($C_{gd}$) by about 4.5%. This reduction in Cgd improves the AC performance of the PFET device. For example, the height of the raised source and drain regions 140 may be reduced by 8 nm in certain embodiments, which is a reduction of over 25%. Further, if the concentration of germanium in the channel layer 13 is increased to 50%, the stress on the channel layer 13 may be increased by about 4%. Of course, higher concentrations of germanium would further increase the stress on the channel layer 13. Additionally, the inclusion of partial oxide spacers 130 further reduces the gate-drain capacitance ($C_{gd}$) by increasing the distance between the raised source and drain regions 140 and the gate 100. This reduction in $C_{gd}$ may be about 2.6% to 5.1%. Thus, in certain embodiments, AC performance may be improved by at least 5% by reducing the height of the raised source and drain regions 140 and partial oxide spacers 130. In certain embodiments, the AC performance is improved by at least 7%.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a P-type Field Effect Transistor (PFET) device using fully depleted silicon on insulator (FDSOI) technology, comprising:
    forming a gate on a workpiece, the workpiece comprising a bulk region, a buried oxide layer and a channel layer; wherein the gate comprises a Hi-K/SiO$_2$ bi-layer, a work function metal, a polysilicon layer and a cap layer;
    implanting germanium ions into the channel layer in regions that are not beneath the gate to form SiGe stressors in the channel layer so as to increase axial stress in the channel layer, wherein a concentration of germanium in the SiGe stressors after implanting is greater than 40%;
    performing a thermal treatment to recrystallize the SiGe stressors after the implanting;
    growing raised source and drain regions on the SiGe stressors on both sides of the gate;
    forming spacers on both sides of the gate before the implanting;
    depositing an oxide layer on the workpiece after the spacers are formed and prior to the thermal treatment; and
    removing at least a portion of the oxide layer after the thermal treatment and prior to growing the raised source and drain regions.

2. The method of claim 1, wherein the channel layer comprises Si—Ge and the concentration of germanium prior to the implanting is up to 35%.

3. The method of claim 1, wherein the concentration of germanium in the SiGe stressors after implanting is between 45% and 60%.

4. The method of claim 1, wherein the implanting is performed at a temperature between −50° C. and −150° C.

5. The method of claim 1, wherein the oxide layer is deposited prior to the implanting.

6. The method of claim 1, wherein an entirety of the oxide layer is removed.

7. The method of claim 1, wherein a portion of the oxide layer is removed and wherein a remaining portion of the oxide layer is disposed on a sidewall of the spacers, wherein the remaining portion is referred to as a partial oxide spacer, and the partial oxide spacer increases a distance between the raised source and drain regions and the gate.

8. The method of claim 7, wherein the portion of the oxide layer is removed using directional reactive ion etching.

9. The method of claim 1, wherein the thermal treatment comprises a rapid temperature anneal or a laser anneal.

10. The method of claim 1, wherein a thickness of the channel layer is between 8 nm and 20 nm.

* * * * *